(12) United States Patent
Kim et al.

(10) Patent No.: US 7,868,338 B2
(45) Date of Patent: Jan. 11, 2011

(54) LIQUID CRYSTAL DISPLAY ARRAY BOARD AND METHOD OF FABRICATING THE SAME

(75) Inventors: Do Young Kim, Ulsan (KR); Hae Jin Heo, Ulsan (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 560 days.

(21) Appl. No.: 11/520,507

(22) Filed: Sep. 12, 2006

(65) Prior Publication Data

US 2007/0161184 A1    Jul. 12, 2007

(30) Foreign Application Priority Data

Nov. 23, 2005    (KR) .................. 10-2005-0112596

(51) Int. Cl.
*H01L 33/00* (2010.01)
*H01L 21/00* (2006.01)

(52) U.S. Cl. .................. 257/98; 257/309; 257/350; 257/532; 257/E33.062; 257/E29.343; 257/E21.012; 438/30; 438/152; 438/155; 438/255; 438/398; 438/964

(58) Field of Classification Search .................. 257/98, 257/309, 351, 350, 532, E33.062, E29.343, 257/E21.012; 438/29, 152, 155, 250, 393, 438/964, 30, 255, 398
See application file for complete search history.

(56) References Cited

U.S. PATENT DOCUMENTS

| 5,213,992 | A  | * | 5/1993 | Lu ............................. 438/398 |
| 5,405,799 | A  | * | 4/1995 | Woo et al. ................... 438/396 |
| 6,878,584 | B2 | * | 4/2005 | Seo et al. .................... 438/239 |
| 7,259,805 | B2 | * | 8/2007 | Song et al. ................... 349/38 |
| 2004/0090562 | A1 | * | 5/2004 | Song et al. ................... 349/39 |

FOREIGN PATENT DOCUMENTS

| JP | 2001-281696 | 10/2001 |
| JP | 2001-337348 | 12/2001 |
| JP | 2002-151407 | 5/2002 |
| JP | 2003-215635 | 7/2003 |

(Continued)

OTHER PUBLICATIONS

Patent Abstracts of Japan, Publication No. 2001-337348, dated Dec. 7, 2001, in the name of Masahito Kenmochi.
Korea Patent Abstracts, Publication No. 1020020088451 A, dated Nov. 29, 2002, in the name of Gwi Hyeon Kim et al.

(Continued)

*Primary Examiner*—Mary Wilczewski
*Assistant Examiner*—Toniae M Thomas
(74) *Attorney, Agent, or Firm*—Christie, Parker & Hale, LLP

(57) ABSTRACT

A liquid crystal display array board includes a plurality of gate wiring lines formed on a substrate and a plurality of data wiring lines crossing the plurality of gate wiring lines, a plurality of thin film transistors formed in areas defined by crossings of the gate wiring lines and the data wiring lines, a plurality of storage capacitor first electrodes that run parallel to the gate wiring lines and patterned to have concavo-convex patterns, a plurality of storage capacitor second electrodes integrated with the drain electrodes of the thin film transistors and formed on the storage capacitor first electrodes, and a plurality of pixel electrodes electrically connected to the drain electrodes.

9 Claims, 5 Drawing Sheets

FOREIGN PATENT DOCUMENTS

| | | | |
|---|---|---|---|
| JP | 2003-295220 | | 10/2003 |
| KR | 2002-0088451 | | 11/2002 |
| KR | 2003-0057142 | | 7/2003 |
| KR | 2003-0075046 | | 9/2003 |
| KR | 2004036987 | * | 5/2004 |

OTHER PUBLICATIONS

Korea Patent Abstracts, Publication No. 1020030057142 A, dated Jul. 4, 2003, in the name of Gyo Seop Choo.

Korean Patent Abstract for Korean Publication No. 1020030075046 A, published Sep. 22, 2003 in the name of Jae U Lee, et al.

* cited by examiner

LIQUID CRYSTAL DISPLAY ARRAY BOARD AND METHOD OF FABRICATING THE SAME

CROSS-REFERENCE TO RELATED APPLICATION

This application claims priority to and the benefit of Korean Patent Application No. 10-2005-00112596, filed on Nov. 23, 2005, in the Korean Intellectual Property Office, the entire content of which is incorporated herein by reference.

BACKGROUND

1. Field of the Invention

The present invention relates to a liquid crystal display, and, more particularly, to a liquid crystal display array board capable of maintaining the capacity of a storage capacitor while reducing the area of the storage capacitor, and a method of fabricating the same.

2. Discussion of Related Art

Cathode ray tubes (CRTs) have been used as screen display devices for displaying picture information on screens. However, the CRTs are large and heavy with small display area.

Therefore, thin film flat panel displays (FPDs) that are thin with large display area that can be easily used in any place have been developed and are replacing the CRTs. In particular, liquid crystal displays (LCDs) have higher resolution than other FPDs and have response speed as high as the response speed of the CRTs when a moving picture is being displayed.

As is well known, optical anisotropy and polarizability of liquid crystal are used to drive an LCD. Since liquid crystal molecules are thin and long, an electromagnetic field is applied to the liquid crystal molecules that are arranged with orientation and polarizability to control the direction in which the molecules are arranged. Therefore, when the orientation is selectively controlled, light is transmitted or shielded in accordance with the orientation of the liquid crystal molecules due to the optical anisotropy of the liquid crystal molecules so that it is possible to display color and image.

In an active matrix type LCD, non-linear active devices are provided to pixels arranged in a matrix and the operations of the pixels are controlled using the switching characteristic of the active devices so that a memory function is realized by the electro-optical effect of liquid crystal.

On the other hand, according to the active matrix type LCD, in order to secure uniformity of a displayed image, it is necessary to maintain a signal voltage input through data wiring lines until next input for a predetermined time. Therefore, a storage capacitor is formed to run parallel to liquid crystal cells.

The storage capacitor formed in the LCD can be categorized as either an on-common mode or an on-gate mode in accordance with a mode in which a charge electrode is used.

The modes are compared with each other as follows. In the on-gate mode, a part of a (n−1)th scan line is used as the charge electrode of an nth pixel. Here, the degree of reduction in aperture ratio is small, the point defect generated in a normally white (NW) mode is not easily found, the yield is high, and the scan signal time is long.

In the on-common mode, a charge electrode is additionally provided. Here, the scan signal time is short, the degree of reduction in the aperture ratio is large, the point defect generated in the NW mode is easily found, and the yield is low.

Hereinafter, a conventional storage capacitor in an on-common mode will be simply described with reference to FIG. 1.

FIG. 1 schematically illustrates an LCD array board of a conventional LCD on which a storage capacitor in an on-common mode is formed.

Referring to FIG. 1, in the LCD array board on which the storage capacitor in the on-common mode is formed, on an insulating substrate that is a lower plate, a plurality of gate wiring lines 9 and 19 and data wiring lines 10 and 20 cross (cross over or intersect) to form crossings (or intersections). In an area defined by a crossing (or an intersection) where an arbitrary data wiring line (for example, 10) and an arbitrary gate wiring line (for example, 19) cross (or intersect each other), a thin film transistor (TFT) is formed. The TFT includes a source electrode 11, a drain electrode 12, a gate electrode 14 that is the same wiring line as the gate wiring line 19, and a semiconductor layer 13. Here, the source electrode 11 is the same wiring line as the data wiring line 10. Also, a pixel electrode 15 is connected to the drain electrode 12 and separated from the scan line 19 and the signal line 10 by a uniform distance. A first electrode 16 of the storage capacitor is positioned to run parallel with the gate wiring line 19 and to cross the pixel electrode 15.

In the storage capacitor in the on-common mode of the above-described structure, charges are accumulated between the pixel electrode 15 (i.e., a second electrode of the storage capacitor) and the first electrode 16 of the storage capacitor that is formed of the same material as the gate electrode 14. Here, the magnitude of the capacitance accumulated in the storage capacitor is determined by $C = \epsilon \cdot A/d$, where $C$, $\epsilon$, $A$, and $d$ represent the capacitance, the dielectric constant, the area of an electrode, and the distance between electrodes, respectively.

In order to secure the uniformity of an image displayed by an LCD, it is required that the capacitance accumulated by the storage capacitor be large. However, when the area of the storage capacitor is increased in order to increase the capacitance, the aperture ratio is reduced such that the total brightness is reduced.

SUMMARY OF THE INVENTION

Accordingly, it is an aspect of the present invention to provide an array board of a liquid crystal display (LCD) including a storage capacitor in an on-common mode in which (1) storage capacitor first electrodes are formed to be concavo-convex using a phase shift mask or a slit mask to increase the area of the first electrodes and (2) drain electrode regions electrically connected to pixel electrodes are used as storage capacitor second electrodes to reduce the distance between the first electrodes and the second electrodes so that the capacitance of the storage capacitor is increased, and it is another aspect of the present invention to provide a method of fabricating the same.

An embodiment of the present invention provides an LCD array board including a plurality of gate wiring lines formed on a substrate and a plurality of data wiring lines crossing the plurality of gate wiring lines, a plurality of thin film transistors formed in areas defined by crossings of the gate wiring lines and the data wiring lines, a plurality of storage capacitor first electrodes parallel to the gate wiring lines and patterned to have concavo-convex patterns, a plurality of storage capacitor second electrodes integrated with drain electrodes of the thin film transistors and formed on the storage capacitor first electrodes, and a plurality of pixel electrodes electrically connected to the drain electrodes.

An embodiment of the present invention provides a method of fabricating an LCD array board, the method including the steps of forming a plurality of gate wiring lines and a plurality of concavo-convex storage capacitor first electrodes on a substrate so that the storage capacitor first electrodes run parallel to the gate wiring lines, forming an insulating layer on the gate wiring lines and the storage capacitor first electrodes, forming a plurality of data wiring lines to cross the plurality of gate wiring lines, and forming a plurality of storage capacitor second electrodes on the insulating layer so that the storage capacitor second electrodes overlap the storage capacitor first electrodes in predetermined regions.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

Figure 1:
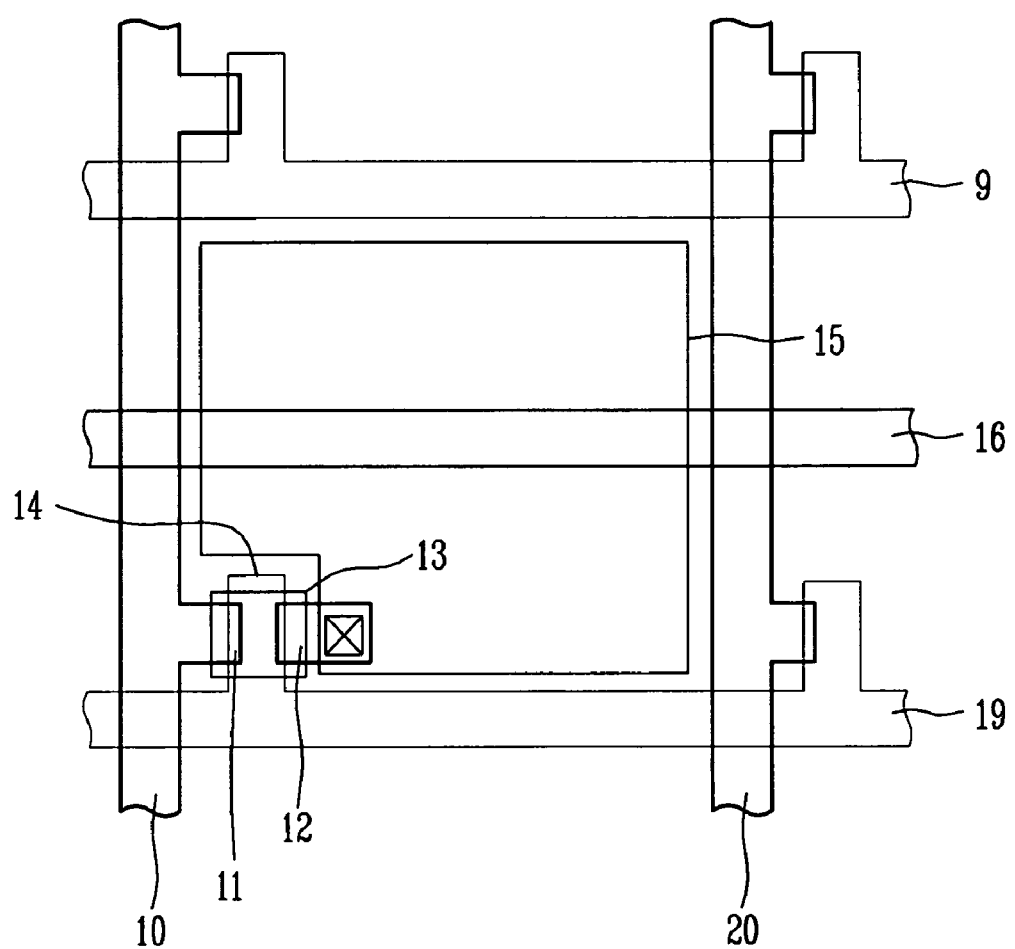
FIG. 1 schematically illustrates a liquid crystal display (LCD) array board of a conventional LCD on which a storage capacitor in an on-common mode is formed.
Figure 2:
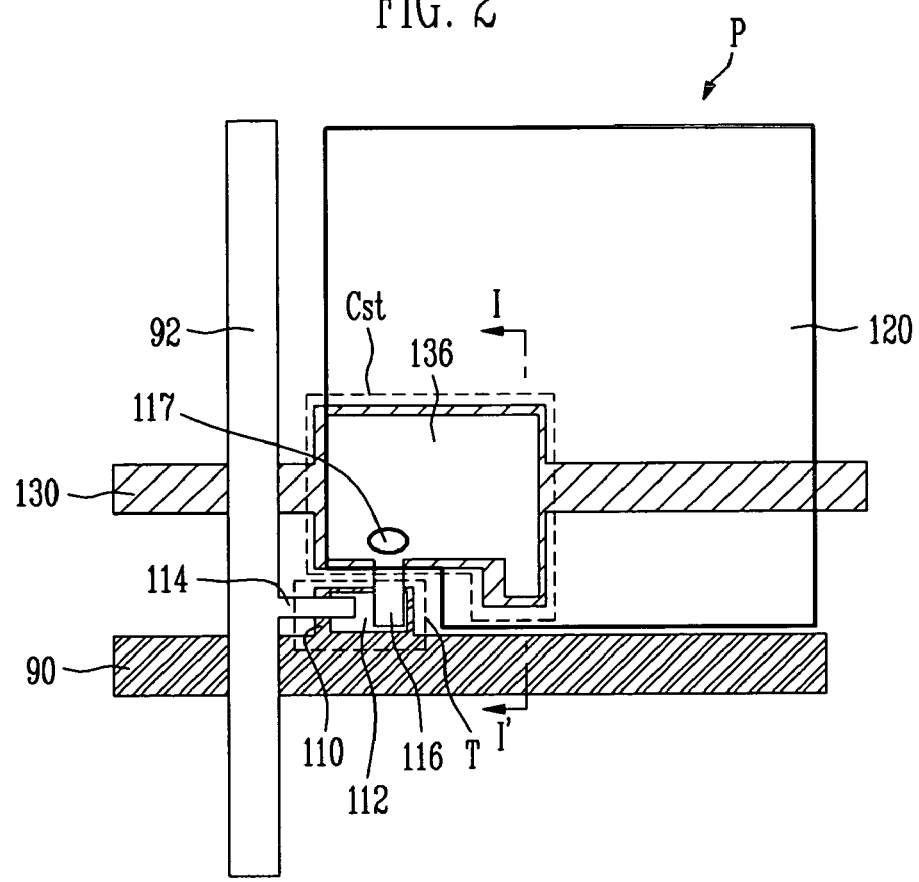
FIG. 2 is a plan view of an LCD array board according to an embodiment of the present invention.
Figure 3:
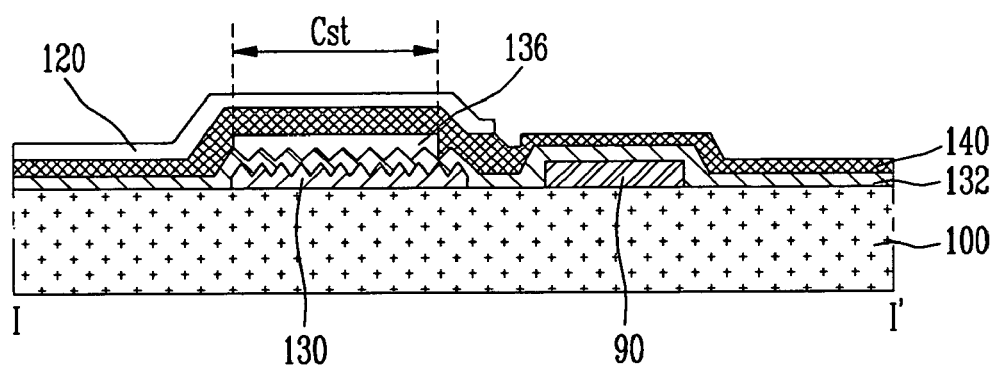
FIG. 3 is a sectional view taken along the line I-I' of FIG. 2.

FIG. 2 is a plan view of a liquid crystal display (LCD) array board according to an embodiment of the present invention and FIG. 3 is a sectional view taken along the line I-I' of FIG. 2.

As illustrated in FIGS. 2 and 3, the LCD array board according to the embodiment of the present invention includes a pixel region P defined by a gate wiring line 90 and a data wiring line 92 that cross (or intersect) each other on a first substrate 100, a pixel electrode 120, a thin film transistor (TFT) T, and a storage capacitor Cst formed on the pixel region P.

Although not shown, the LCD according to the present invention includes color filters formed in regions corresponding to a plurality of pixel regions P; black matrices formed among (or between) the color filters and to correspond with predetermined parts of a plurality of TFTs T and a plurality of storage capacitors Cst; a second substrate, on which transparent common electrodes are formed, on the color filters and the black matrices; and liquid crystal molecules filled in between the first substrate and the second substrate.

Each of the TFTs T that are switching devices is positioned on one side of each of the pixel regions P in a matrix to form a plurality of gate wiring lines 90 and a plurality of data wiring lines 92 that cross (or intersect) the TFTs. The pixel regions P are defined by the gate wiring lines 90 and the data wiring lines 92 that cross (cross over or intersect) each other. A plurality of pixel electrodes 120 formed on the pixel regions P are made of transparent and conductive metal having high transmittance of light such as indium tin oxide (ITO).

In the LCD, a liquid crystal layer positioned on the pixel electrodes 120 is oriented by the signals applied from the TFTs T and the amount of light that transmits through the liquid crystal layer is controlled by the degree of orientation of the liquid crystal layer so that it is possible to display an image.

The gate wiring lines 90 apply a pulse voltage that drives gate electrodes 110 that are first electrodes of the TFTs T, and the data wiring lines 92 apply a signal voltage that drives source electrodes 114 that are second electrodes of the TFTs T.

The TFTs T include the gate electrodes 110, the source electrodes 114, drain electrodes 116, and active layers 112. The source electrodes 114 are connected to the data wiring lines 92 and the gate electrodes 110 are connected to the gate wiring lines 90 that cross (or intersect) the data wiring lines 92 to define the pixel regions P.

That is, when a predetermined pulse voltage is applied to the gate electrodes 110, the active layers 112 are activated so that the drain electrodes 116 receive the signal voltage from the data wiring lines 92 through the source electrodes 114 and through the active layers 112 thereunder. The source electrodes 114 are connected to (or parts of) the data wiring lines 92 and separated from the drain electrodes 116 by a predetermined distance, and the drain electrodes 116 are electrically connected to the pixel electrodes 120 through contact holes 117. As a result, the signal voltage is applied to the pixel electrodes 120 when the active layers 112 are activated.

Referring back to FIGS. 2 and 3, a first electrode 130 of the storage capacitor Cst is formed to run parallel to the gate wiring line 90, and an insulating layer 132 and a second electrode 136 integrated with a drain electrode 116 are sequentially formed on the first electrode 130 to form the storage capacitor Cst. Here, the insulating layer 132 may be used as a gate insulating layer.

According to the present invention, the first electrode 130 is formed of the same metal as the gate wiring line 90 and/or has a concavo-convex pattern unlike the gate wiring line 90.

The first electrode 130 is obtained by exposing the region in which the first electrode 130 is to be formed using a phase shift mask or a slit mask during a mask process.

As such, it is possible to increase the area of the first electrode 130 of the storage capacitor Cst (e.g., because the first electrode 130 has the convavo-convex pattern) so that it is possible to increase the capacitance of the storage capacitor Cst.

Also, according to the present invention, the pixel electrode 120 is not used as the second electrode of the storage capacitor Cst, and, instead, a drain electrode unit (116 and 136) is used as the second electrode 136 of the storage capacitor Cst.

Here, the drain electrode unit refers to the drain electrode 116 and the second electrode 136 integrated with the drain electrode 116.

As illustrated in FIGS. 2 and 3, the drain electrode unit has a large area to be connected to the pixel electrode 120 through a contact hole 117 formed on a protective layer 140 and to overlap the first electrode 130 so that the drain electrode unit is used as the second (or upper) electrode 136 of the storage capacitor Cst.

That is, the second electrode 136 integrated with the drain electrode 116 and overlapping the first electrode 130 is provided to reduce the distance between the two electrodes 130 and 136 of the storage capacitor Cst so that it is possible to increase the capacitance of the storage capacitor Cst.

Therefore, when a necessary capacitance value is determined in each pixel region, since the present invention can obtain the same capacitance value as a conventional storage capacitor with an area smaller than the area of the conventional storage capacitor, it is possible to obtain an effect of increasing the aperture ratio and to thus increase the entire brightness of the LCD.

The LCD array board having the above-described structure is obtained by sequentially performing a deposition process, a photolithography process, and an etching process. In the photolithography process, a photo resist (PR) is selectively irradiated with light using a mask of a desired pattern to form the same pattern as the pattern of the mask using the principle in which the PR generates a chemical reaction to change its characteristic when the PR is irradiated with light. The photolithography process includes a PR applying process for applying the PR corresponding to a film of a common picture, an exposure process for selectively radiating light using a mask, and a development process for removing the PR of the part irradiated with light using developer to form a pattern.

Figure 4A:
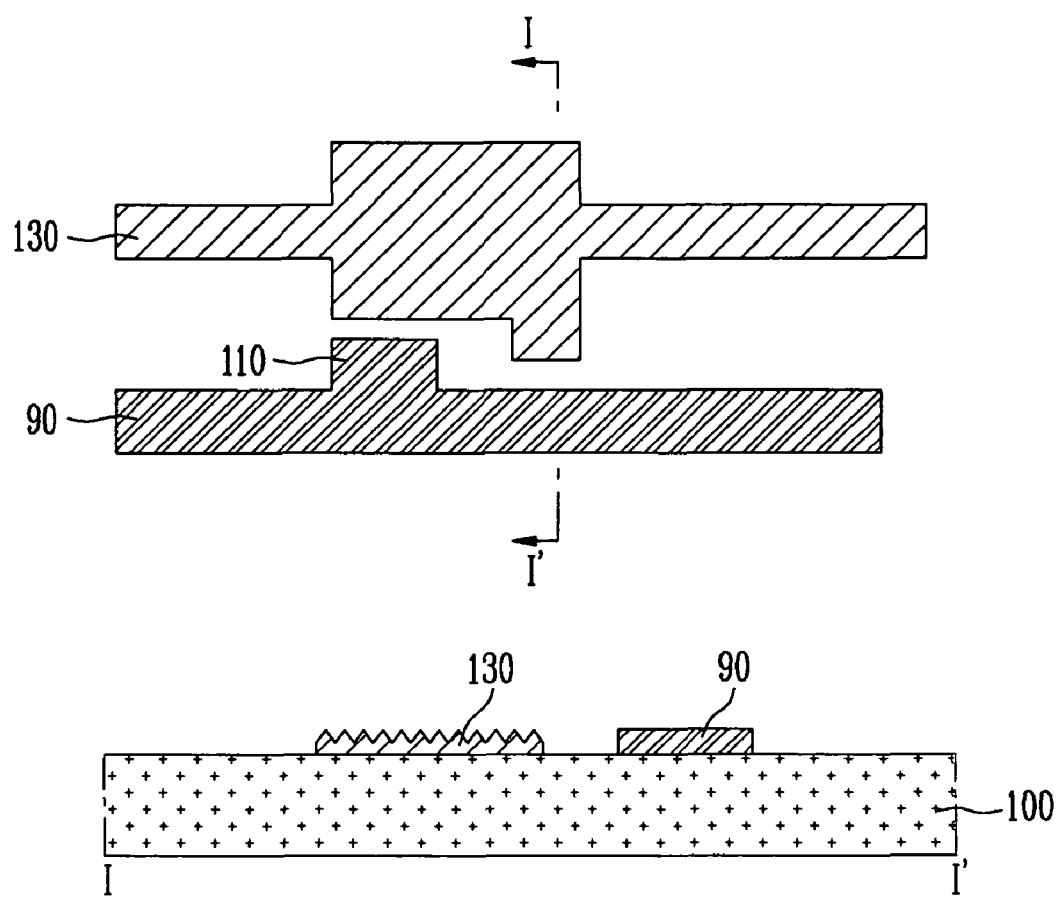
FIGS. 4A to 4C are plan views and sectional views illustrating processes of fabricating an LCD according to an embodiment of the present invention.
Figure 4B:
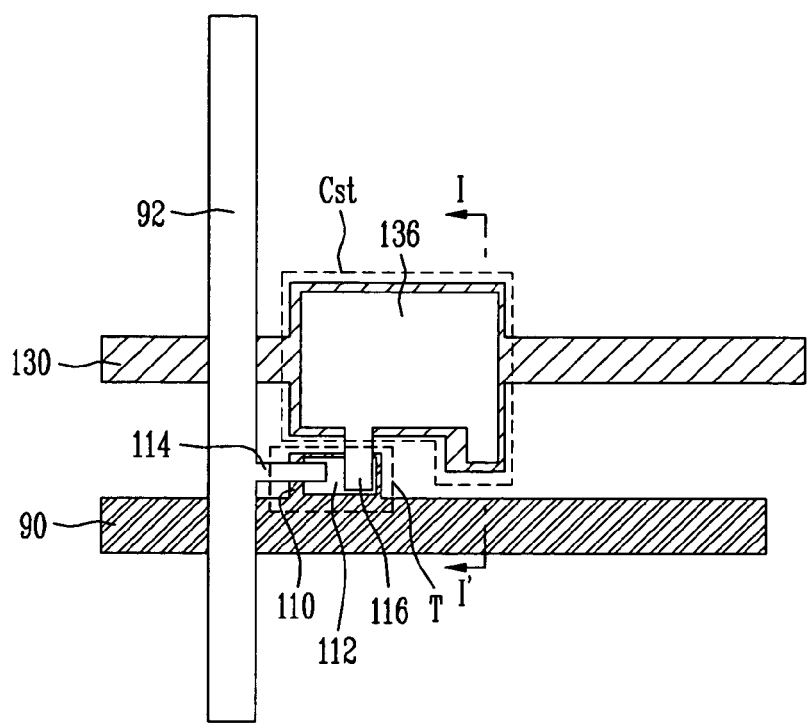
Figure 4B:
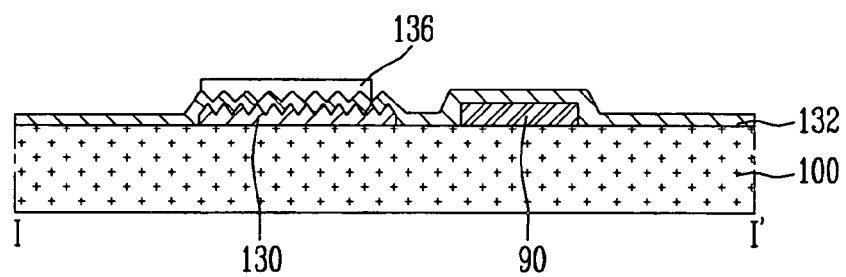
Figure 4C:
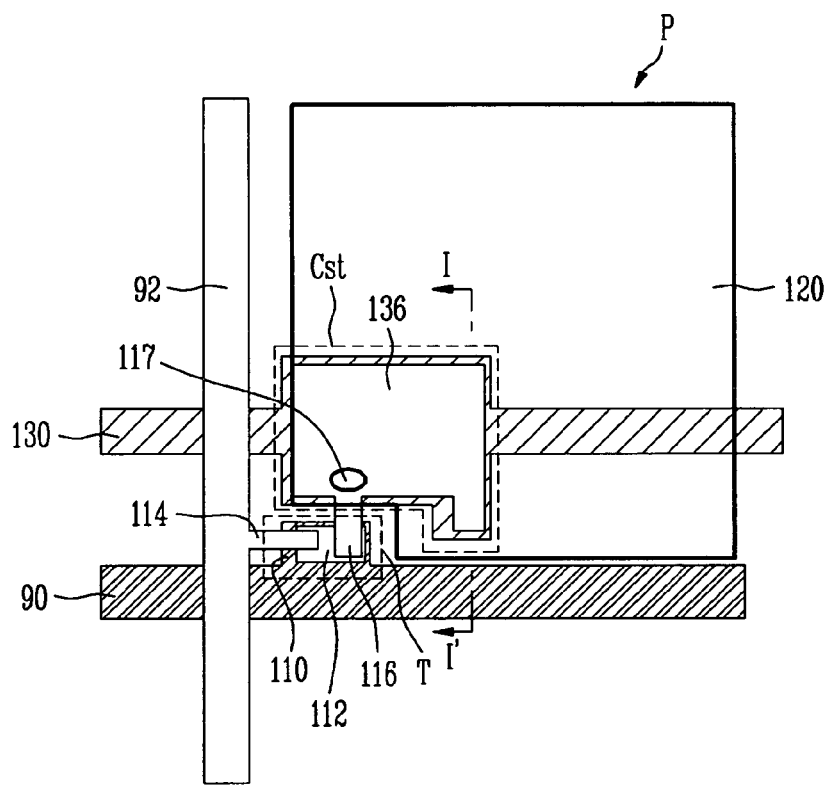
Figure 4C:
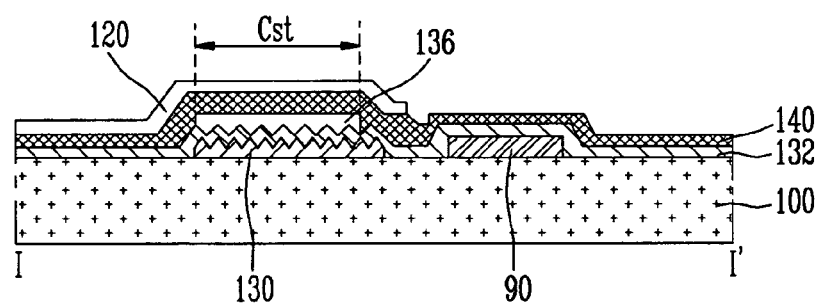

FIGS. 4A to 4C are plan views and sectional views illustrating processes of fabricating an LCD according to an embodiment of the present invention.

First, referring to FIG. 4A, a predetermined metal is deposited on the entire surface of the insulating substrate 100 and is patterned and developed using a mask to form the gate wiring line 90, the gate electrode 110, and the first electrode 130 of the storage capacitor Cst.

According to the present invention, the first electrode 130 of the storage capacitor Cst is formed to be concavo-convex unlike the gate wiring line 90 and the gate electrode 110. Therefore, the mask positioned on the first electrode 130 is a phase shift mask or a slit mask for performing exposure unlike the mask for forming the patterns of the gate wiring line 90 and the gate electrode 110.

Then, as illustrated in FIG. 4B, the gate insulating layer 132, an amorphous semiconductor layer (a silicon layer), an amorphous semiconductor layer (a silicon layer) containing impurities, and a conductive metal layer are deposited on the substrate 100 where the gate wiring line 90 is formed. The data wiring line 92 that crosses (or intersects) the gate wiring line 90 to define the pixel region, the source electrode 114 that perpendicularly protrudes from the data wiring line 92 to have a predetermined area, and the drain electrode unit 116 and 136 that is separated from the source electrode 114 by a predetermined distance are then formed by the photolithography and etching processes.

Here, the drain electrode unit (116 and 136) has a large area to overlap the first electrode 130 of the storage capacitor so that the drain electrode unit formed in the region that overlaps the first electrode 130 becomes the second electrode 136 of the storage capacitor Cst.

Next, the exposed impurity amorphous silicon layer is etched using the patterned metal layer as an etching prevention layer so that the amorphous silicon layer is exposed on the source electrode 114 and the drain electrode 116 to realize the active layer 112. As a result, the TFT T composed of the gate electrode 110, the source and drain electrodes 114 and 116, and the active layer 112 is obtained.

Next, as illustrated in FIG. 4C, the protective layer 140 is formed on the substrate 100 where the data wiring line 92 is formed. The protective layer 140 is formed by an insulating material and is patterned so that a contact hole 117 is formed on the drain electrode unit (116 and 136), and then the pixel electrode 120 connected to the drain electrode unit through the contact hole 117 is formed.

That is, the pixel electrode 120 is electrically connected to the drain electrode unit through the contact hole 117 to be electrically connected to the second electrode 136 of the storage capacitor Cst.

As a result, according to the present invention, the first electrode 130 of the storage capacitor Cst is formed to be concavo-convex through the exposure process performed by the phase shift mask or the slit mask so that it is possible to obtain an effect of increasing the area of the first electrode of the storage capacitor. Also, according to the present invention, instead of using the pixel electrode, the drain electrode unit is used as the second electrode (e.g., the second electrode 136) of the storage capacitor so that it is possible to reduce the distance between the two electrodes of the storage capacitor and to thus increase the capacitance of the storage capacitor.

Therefore, when a necessary capacitance value is determined in each pixel region, since the present invention can obtain the same capacitance value as a conventional storage capacitor with an area smaller than the area of the conventional storage capacitor, it is possible to obtain an effect of increasing the aperture ratio and to thus increase the entire brightness of the LCD.

According to the present invention, the first electrode of the storage capacitor is formed to be concavo-convex using the phase shift mask or the slit mask to increase the area of the first electrode, and the drain electrode region electrically connected to the pixel electrode is used as the second electrode of the storage capacitor to reduce the distance between the first electrode and the second electrode so that the capacitance of the storage capacitor is increased.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A liquid crystal display array board comprising:
   a plurality of gate wiring lines on a substrate and a plurality of data wiring lines crossing the plurality of gate wiring lines;
   a plurality of thin film transistors at crossings of the gate wiring lines and the data wiring lines;
   a plurality of on-common storage capacitor first electrodes parallel to and spatially separated from the gate wiring lines and patterned to have concavo-convex patterns;
   a plurality of electrode units, each of the electrode units having a first portion utilized as one of a plurality of on-common storage capacitor second electrodes and a second portion utilized as a corresponding one of a plurality of drain electrodes of the thin film transistors, the electrode units being on the storage capacitor first electrodes; and
   a plurality of pixel electrodes spatially separated from the on-common storage capacitor second electrodes and electrically connected to the drain electrodes.

2. The liquid crystal display array board as claimed in claim 1, wherein the storage capacitor first electrodes are formed by substantially the same material as the gate wiring lines.

3. The liquid crystal display array board as claimed in claim 1, wherein the storage capacitor first electrodes are formed in substantially the same layer as the gate wiring lines.

4. The liquid crystal display array board as claimed in claim 1, wherein an insulating layer is formed between the storage capacitor first electrodes and the storage capacitor second electrodes.

5. The liquid crystal display array board as claimed in claim 4, wherein the insulating layer is a gate insulating layer.

6. The liquid crystal display array board as claimed in claim 1, wherein the thin film transistors comprise a plurality of gate electrodes, a plurality of source electrodes, the drain electrodes, and a plurality of active layers, wherein the source electrodes are connected to the data wiring lines, and wherein the gate electrodes are connected to the gate wiring lines crossing the data wiring lines to define a plurality of pixel regions.

7. A method of fabricating a liquid crystal display array board, the method comprising:
   forming a plurality of gate wiring lines and a plurality of concavo-convex storage capacitor first electrodes on a substrate so that the storage capacitor first electrodes run parallel to the gate wiring lines;
   forming an insulating layer on the gate wiring lines and the storage capacitor first electrodes;
   forming a plurality of data wiring lines to cross the plurality of gate wiring lines; and
   forming a plurality of storage capacitor second electrodes on the insulating layer so that the storage capacitor second electrodes overlap the storage capacitor first electrodes in predetermined regions,
   wherein the concavo-convex patterns of the convavo-convex storage capacitor first electrodes are formed by exposing the regions in which the first storage capacitor electrodes are to be formed using a phase shift mask or a slit mask during a mask process.

8. The method as claimed in claim 7, further comprising:
   forming a plurality of pixel electrodes in the pixel regions at crossings of the gate wiring lines and the data wiring lines on a protective layer.

9. The method as claimed in claim 8, wherein the pixel electrodes are electrically connected to drain electrodes of a plurality of thin film transistors through a plurality of contact holes formed in predetermined positions of the protective layer, the drain electrodes being integrated with the capacitor storage second electrodes.

* * * * *